United States Patent
Lindberg et al.

(10) Patent No.: US 9,219,199 B2
(45) Date of Patent: Dec. 22, 2015

(54) METHOD OF PRODUCING AN OPTOELECTRONIC COMPONENT HAVING A SULFUR-ADHESION LAYER BONDED TO A DIELECTRIC LAYER

(75) Inventors: Gudrun Lindberg, Bad Abbach (DE); Lutz Höppel, Alteglofsheim (DE); Heribert Zull, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/234,499

(22) PCT Filed: Jul. 23, 2012

(86) PCT No.: PCT/EP2012/064434
§ 371 (c)(1),
(2), (4) Date: Feb. 21, 2014

(87) PCT Pub. No.: WO2013/017466
PCT Pub. Date: Feb. 7, 2013

(65) Prior Publication Data
US 2014/0295589 A1    Oct. 2, 2014

(30) Foreign Application Priority Data

Jul. 29, 2011 (DE) .................. 10 2011 108 793
Oct. 5, 2011 (DE) .................. 10 2011 114 865

(51) Int. Cl.
*H01L 33/00* (2010.01)
*H01L 33/44* (2010.01)
*H01S 5/028* (2006.01)

(52) U.S. Cl.
CPC .............. *H01L 33/44* (2013.01); *H01L 33/005* (2013.01); *H01S 5/0282* (2013.01)

(58) Field of Classification Search
CPC ...... H01L 33/005; H01L 33/44; H01S 5/0282
See application file for complete search history.

(56) References Cited

U.S. PATENT DOCUMENTS

| 6,762,113 | B2 | 7/2004 | Jeans et al. | |
|---|---|---|---|---|
| 7,186,634 | B2 | 3/2007 | Yoneya | |
| 2004/0245518 | A1 | 12/2004 | Ramanath et al. | |
| 2005/0211989 | A1* | 9/2005 | Horio et al. | 257/79 |
| 2006/0081868 | A1 | 4/2006 | Kotani et al. | |
| 2008/0192472 | A1 | 8/2008 | Verschuuren et al. | |

(Continued)

FOREIGN PATENT DOCUMENTS

| JP | 2003-276110 A | 9/2003 |
|---|---|---|
| JP | 2005-086147 | 3/2005 |
| JP | 2005-302747 A | 10/2005 |

OTHER PUBLICATIONS

Machine Translation of JP-2003-276110.*

(Continued)

*Primary Examiner* — Caleb Henry
*Assistant Examiner* — Alexander Belousov
(74) *Attorney, Agent, or Firm* — DLA Piper LLP (US)

(57) ABSTRACT

An optoelectronic component includes a semiconductor layer sequence having an optoelectronically active region; a dielectric layer on the semiconductor layer sequence; and a metal layer on the dielectric layer, wherein an adhesion layer is arranged between the dielectric layer and the metal layer, the adhesion layer being covalently bonded to the dielectric layer and to the metal layer.

9 Claims, 4 Drawing Sheets

(56) References Cited

U.S. PATENT DOCUMENTS

| | | |
|---|---|---|
| 2009/0166665 A1 | 7/2009 | Haitko |
| 2010/0052007 A1 | 3/2010 | Osawa et al. |
| 2010/0230698 A1 | 9/2010 | Rode et al. |
| 2010/0283382 A1 | 11/2010 | Kwak et al. |
| 2011/0006032 A1 | 1/2011 | Porro et al. |

OTHER PUBLICATIONS

Machine Translation of JP-2005-302747.*

T. Fudei et al., "Improved adhesion by introducing MPTMS-SAM at the interface of Ag thin film/SiO$_2$ layer," Society of Applied Physics, vol. 2, 2009, pp. 665 (with translation).

English translation of a Japanese Examination Report dated Jan. 27, 2015 in corresponding Japanese Application No. 2014-522053.

Celle, C., et al., "Self-assembled monolayers for electrode fabrication and efficient threshold voltage control of organic transistors with amorphous semiconductor layer," *Organic Electronics*, Elsevier, Bd. 10, Feb. 1, 2009, pp. 119-126.

Jeong, H, et al., "Control of the electrical and adhesion properties of metal/organic interface with self-assembled monolayers," *Applied Physics Letters*, Bd. 86. Nr. 17, Apr. 19, 2005, pp. 174906-1 to 174906-3.

Lim, C., et al. "Improvements in electrical characteristics of plasma enhanced chemical vapor deposition-tetraethylorthosilicate-SiO2 by atomic hydrogen passication via hot-wire technique," *Japanese Journal of Applied Physics*, Bd. 45, Nr. 48, Dec. 1, 2006, pp. 1270-1272.

Lim, H. et al., "Fabrication of Carbon Nanotube/SiO$_2$ and Carbon Nanotube/SiO$_2$/Ag Nanoparticles Hybrids by Using Plasma Treatment," Nanoscale Res Lett, 2009, pp. 1384-1388.

* cited by examiner

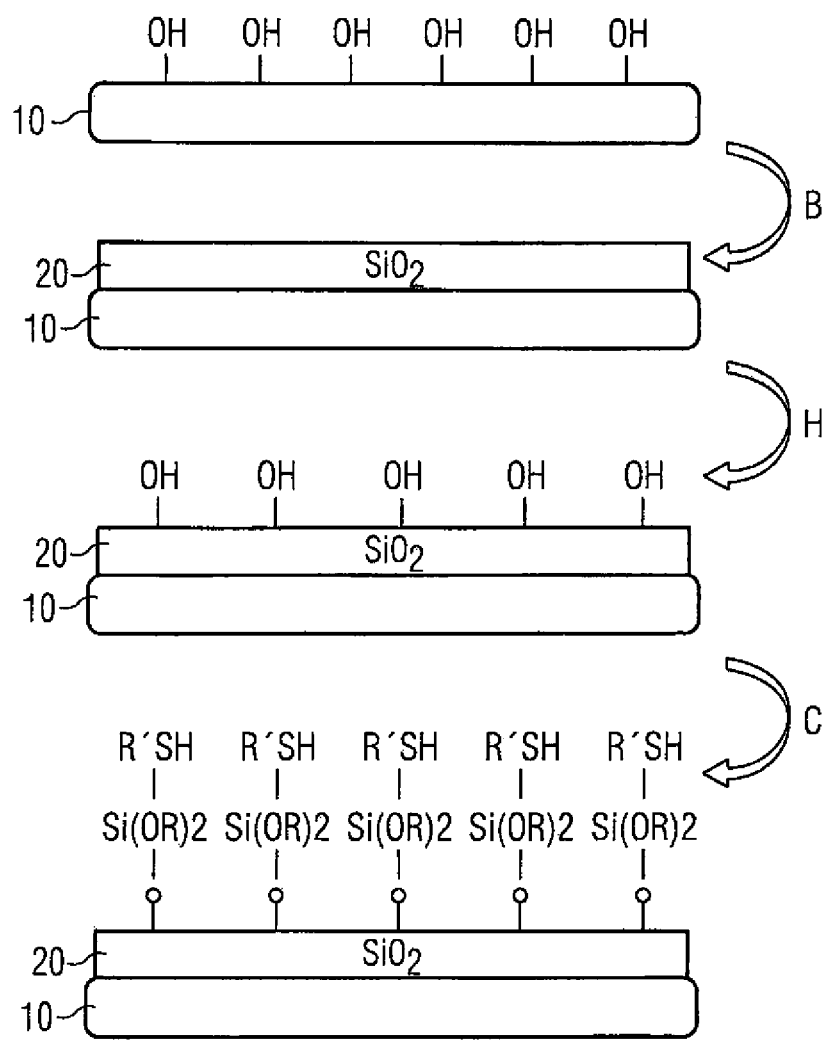

METHOD OF PRODUCING AN OPTOELECTRONIC COMPONENT HAVING A SULFUR-ADHESION LAYER BONDED TO A DIELECTRIC LAYER

TECHNICAL FIELD

This disclosure relates to an optoelectronic component and a method of producing an optoelectronic component.

BACKGROUND

Optoelectronic components often contain metallization layers applied to passivation layers. To bond these layers to one another, hitherto use has been made of up to 1 nm thick metallic adhesion layers, for example, composed of titanium which, however, due to the production methods associated therewith, are not atomically smooth and therefore do not form a continuous layer. Rather, local accumulations of the respective metal are present. Moreover, it is not possible to control whether a covalent bond actually forms between the passivation layer and the following metallization layer. Moreover, the metallic adhesion layers known hitherto are chemically reactive in aqueous media such that the metallic adhesion layer even in the finished component remains susceptible in particular to degradation by moisture.

It could therefore be helpful to provide an optoelectronic component which has improved properties as well as a method of producing an optoelectronic component which has improved properties.

SUMMARY

We provide an optoelectronic component including a semiconductor layer sequence having an optoelectronically active region, a dielectric layer on the semiconductor layer sequence, and a metal layer on the dielectric layer, wherein an adhesion layer is arranged between the dielectric layer and the metal layer, said adhesion layer being covalently bonded to the dielectric layer and to the metal layer.

We also provide a method of producing an optoelectronic component including A) providing a semiconductor layer sequence having an optoelectronically active region, B) applying a dielectric layer to the semiconductor layer sequence, C) functionalizing a surface of the dielectric layer facing from the semiconductor layer sequence, and D) applying a metal layer to the functionalized surface, wherein a starting material covalently bonded to the dielectric layer is formed in C), which starting material, in D), forms a covalent bond to the metal layer with formation of an adhesion layer.

We further provide an optoelectronic component including a semiconductor layer sequence having an optoelectronically active region, a dielectric layer on the semiconductor layer sequence, and a metal layer on the dielectric layer, wherein an adhesion layer is arranged between the dielectric layer and the metal layer, said adhesion layer being covalently bonded to the dielectric layer and to the metal layer, the adhesion layer comprises sulfur, and a sulfur atom of the sulfur is bonded to the material of the dielectric layer via a covalent bond and also to the metal layer via a further covalent bond.

BRIEF DESCRIPTION OF THE DRAWINGS

FIG. 5 shows, in schematic side view, a method in accordance with a further exemplary embodiment for producing an optoelectronic component.

DETAILED DESCRIPTION

Figure 1:
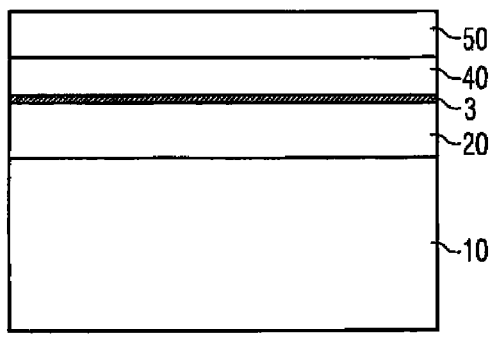
FIG. 1 shows the schematic side view of a conventional optoelectronic component.

Our optoelectronic component comprises a semiconductor layer sequence having an optoelectronically active region. The component comprises a dielectric layer on the semiconductor layer sequence and a metal layer on the dielectric layer. In this case, an adhesion layer is arranged between the dielectric layer and the metal layer, the adhesion layer being covalently bonded to the dielectric layer and to the metal layer.

The semiconductor layer sequence can be a layer sequence of a plurality of layers (e.g. a sequence of a p-doped and an n-doped semiconductor layer).

The fact that one layer or one element is arranged or applied "on" another layer or another element can in this case mean that the one layer or one element is arranged directly in direct mechanical and/or electrical contact on the other layer or the other element. Furthermore, it can also mean that the one layer or one element is arranged indirectly on or above the other layer or the other element. In this case, further layers and/or elements can then be arranged between the one layer and the other layer and/or between the one element and the other element.

The fact that one layer or one element is arranged "between" two other layers or elements can mean that the one layer or one element is arranged directly in direct mechanical and/or electrical contact or in indirect contact with one of the two other layers or elements and in direct mechanical and/or electrical contact or in indirect contact with the other of the two other layers or elements. In this case, with indirect contact, further layers and/or elements can then be arranged between the one layer and at least one of the two other layers and/or between the one element and at least one of the two other elements.

The term "component" is taken to mean not only finished components, such as LEDs or laser diodes, for example, but also substrates and/or semiconductor layers such that, for example, a composite comprising, for example, a copper layer and a semiconductor layer can already constitute a component and form part of a superordinate second component in which, for example, electrical connections are additionally present.

The optoelectronic component can be a semiconductor chip. The semiconductor chip can have as optoelectronically active region an active layer, for example, a pn-junction, a double heterostructure, a single quantum well structure (SQW structures) or a multiple quantum well structure (MQW structures). Besides the active region, the semiconductor layer sequence can comprise further functional layers and functional regions selected from p- and n-doped charge carrier transport layers, that is to say electron and hole transport layers, p-doped, n-doped and undoped confinement, cladding and wave guide layers, barrier layers, planarization layers, buffer layers, protective layers and electrodes and combinations of the layers mentioned.

The semiconductor layer sequence can be formed as an epitaxial layer sequence, that is to say as an epitaxially grown semiconductor layer sequence. In this case, the semiconductor layer sequence can be formed in particular as a nitride semiconductor system. The term nitride semiconductor system encompasses all nitride compound semiconductor materials. This can involve, for example, a semiconductor structure comprising a binary, ternary and/or quaternary compound of elements of main group III with a nitride. Examples of such materials are BN, AlGaN, GaN, InAlGaN or further III-V compounds. In this sense, the semiconductor layer sequence can be based on InAlGaN. InAlGaN-based semiconductor chips and semiconductor layer sequences include, in particular, those in which the epitaxially produced semiconductor layer sequence generally has a layer sequence composed of different individual layers which contains at least one individual layer comprising a material from the III-V compound semiconductor material system $In_xAl_yGa_{1-x-y}N$ where $0 \leq x \leq 1$, $0 \leq y \leq 1$ and $x+y \leq 1$.

Semiconductor layer sequences having at least one active layer based on InGaAlN can emit, for example, electromagnetic radiation in an ultraviolet to green or green-yellow wavelength range.

Furthermore, the semiconductor layer sequence can be, for example, based on AlGaAs. AlGaAs-based semiconductor chips and semiconductor layer sequences include, in particular, those in which the epitaxially produced semiconductor layer sequence generally has a layer sequence composed of different individual layers which contain at least one individual layer comprising a material from the III-V compound semiconductor material system $Al_xGa_{1-x}As$ where $0 \leq x \leq 1$. In particular, an active layer comprising an AlGaAs-based material may be suitable for emitting electromagnetic radiation having one or more spectral components in a red to infrared wavelength range. Furthermore, such a material can comprise In and/or P in addition or as an alternative to the elements mentioned.

Alternatively or additionally, the semiconductor layer sequence or the semiconductor chip can also comprise II-VI compound semiconductor material systems besides or instead of the III-V compound semiconductor material systems.

All materials indicated above can comprise one or more dopants and additional constituents which substantially do not change the physical properties of the material.

Furthermore, "dielectric layer" means a passivation layer, for example. The metal layer can be a contact layer or else a seed layer on which a further layer, for example, a further metal layer, can be applied.

The expression that the adhesion layer is covalently bonded to the dielectric layer and to the metal layer means that the adhesion layer comprises a material which forms covalent bonds both to the material of the dielectric layer and to the material of the metal layer. In this regard, atoms which can form covalent bonds with the material of the adhesion layer are present at least at the mutually opposite surfaces of the dielectric layer and at the metal layer. To put it another way, a covalent bridging of the dielectric layer with the metal layer is present. As a result, for example, microchannels or pores within the adhesion layer can be avoided or reduced while the adhesion layer and the succeeding metal layer are formed.

Later component degradation as a result of the ingress of aqueous chemicals can thus be avoided or reduced since few or no weak points are present within the layer construction. An increased robustness and component quality of the optoelectronic component can thus be brought about. The aqueous chemicals can in this case be either process chemicals that surround the component during its completion, or alternatively moisture during the later operation of the component. The increased robustness of the component also results in an increase in yield.

The adhesion layer can be a monolayer. In this context, a monolayer means a layer formed from a single layer of a molecule or an atom. The thickness of the adhesion layer thus corresponds to the thickness of the monolayer. It is thus possible to provide a very thin adhesion layer between the dielectric layer and the metal layer, which simultaneously ensures an improved adhesion between these layers.

As a result of the use of monolayers as adhesion layers within an optoelectronic component, the component geometry is not altered despite the adhesion layer remaining in the finished component.

The adhesion layer can comprise sulfur. The monolayer is thus a sulfur layer. The latter can comprise sulfur or consist thereof. In this case, each sulfur atom is bonded to the material of the dielectric layer via a covalent bond and also to the metal layer via a further covalent bond. Consequently, the adhesion layer can also be designated as a sulfur bridge between the dielectric layer and the metal layer. The sulfur bridge is a covalent bridging between a dielectric layer and metal layer, which leads to an improved adhesion between the two layers.

In this case, the dielectric layer can comprise a material selected from a group comprising silicon oxide, silicon nitride, aluminum oxide, zirconium oxide, titanium oxide, yttrium oxide and silicon. Examples thereof are $Si_yO_x$, $Si_uN_v$, $M_mO_n$, where M can be selected from Al, Zr, Ti and Y and where the parameters can be selected depending on the application and different stoichiometries of the compositions can thus result. In this regard, a dielectric layer can comprise, for example, $SiO_2$, $Si_3N_4$, $Al_2O_3$, $ZrO_2$, $TiO_2$ or $Y_2O_3$. Further oxides or nitrides as materials of the dielectric layer are likewise conceivable. The dielectric layer can furthermore have structurings, for example, in the form of feedthroughs to realize plated-through holes, in particular.

The metal layer can be reflective to radiation that can be generated in the active region. Consequently, the metal layer can be a mirror layer, for example. The mirror layer has the effect that radiation generated in the active region of the semiconductor layer sequence and intended to be emitted on that side of the semiconductor layer sequence facing away from the mirror layer is reflected back from the mirror layer into the semiconductor layer sequence, whereby radiation losses can be reduced or prevented. The radiation that can be generated in the semiconductor layer sequence can be visible radiation.

The metal layer can comprise silver, for example. The metal layer can therefore comprise silver or consist thereof. Silver has a particularly good reflectivity to visible radiation. Other reflective materials are likewise possible as material of the metal layer.

A further layer can be arranged on the metal layer. The further layer can comprise a material selected from a group comprising Ag, Au, Ge, Ni, Ti, Cr, Pd, Pt, ZnO and Cu. Consequently, said further layer can be a metallization layer, for example, which can serve as a contact layer, for example, in the optoelectronic component. The metal layer can therefore also be designated as first metal layer, and the further layer as second metal layer arranged on the first metal layer.

The metal layer, in particular the metallic nanoparticles present on the surface facing away from the dielectric layer, serves as a seed layer for the further layer, on which seed layer the further layer can be formed particularly well. The presence of a seed layer on which the further layer is applied thus leads to a homogeneous, defect-reduced and direct linkage of the further layer on the metal layer without the use of a hitherto used adhesion promotersuch as titanium or chromium, for example. As a result of the homogeneous distribution of the adhesion layer in the form of a monolayer on the dielectric layer, a uniform distribution of the metal layer on the monolayer is also brought about, as a result of which in turn a uniform distribution of the further layer on the metal layer can be obtained.

We also provide a method of producing an optoelectronic component is furthermore. This method comprises the following method steps:

A) providing a semiconductor layer sequence having an optoelectronically active region;

B) applying a dielectric layer to the semiconductor layer sequence;

C) functionalizing that surface of the dielectric layer which faces away from the semiconductor layer sequence; and D) applying a metal layer to the functionalized surface.

In this case, a starting material covalently bonded to the dielectric layer is formed in method step C), which starting material, in method step D), forms a covalent bond to the metal layer with the formation of an adhesion layer.

An optoelectronic component having an improved adhesion between the dielectric layer and the metal layer can be produced by this method. By way of example, an optoelectronic component as described above can be produced. The definitions—explained with regard to the component—of terms and arrangements within the component apply analogously with regard to the method. Furthermore, the layers and/or elements produced in the method contain, unless indicated otherwise, the materials of identically designated layers and/or elements as indicated with regard to the component.

The method steps indicated can be carried out in the temporal order corresponding to the order of their enumeration. Two or more method steps can also be effected simultaneously or overlap such that they cannot be separated from one another as individual method steps.

Method step A) can be effected, for example, by epitaxially growing semiconductor materials.

Method steps B) and C) can be carried out by a method selected from a group comprising a wet-chemical method, plasma-enhanced vapor deposition and atomic layer deposition. In each case different methods or the same methods can be selected here for method steps B) and C). By way of example, method step B) can be carried out by plasma-enhanced vapor deposition or atomic layer deposition, and method step C) can be carried out by a wet-chemical method. In accordance with a further example, method steps B) and C) can both be carried out by plasma-enhanced vapor deposition or by atomic layer deposition.

Independently of which method is selected to carry out method steps B) and C), the same precursor materials can be used for all the methods.

In this regard, by way of example, a mixture of a first and a second precursor material in liquid form and, if appropriate, with addition of solvents can be applied to the semiconductor layer sequence to which a dielectric layer has already been applied. In this case, first the surface of the dielectric layer is perfected by the first precursor material, for example, terminated with hydroxide groups, and then the functionalized surface of the dielectric layer is formed from the second precursor material.

The precursor materials can be applied to produce the functionalized dielectric layer, for example, by plasma-enhanced chemical vapor deposition (PECVD). In this case, a plasma can be produced in a volume above and/or around the semiconductor layer sequence, wherein the precursor materials are fed to the volume and can be ionized in the plasma and excited to react with one another. Production of the plasma can make it possible that the temperature to which the one surface of the semiconductor layer sequence to which the dielectric layer is intended to be applied has to be heated to make it possible to produce the dielectric layer can be reduced compared to a plasmaless CVD method. That can be advantageous in particular if the semiconductor layer sequence would be irreversibly damaged at a temperature above a maximum temperature.

In method steps B) and C), therefore, a first and a second precursor material can be deposited on the semiconductor layer sequence by plasma-enhanced vapor deposition, wherein the dielectric layer forms from the first precursor material and is functionalized in situ by the second precursor material. In this regard, a functionalized surface is obtained on the dielectric layer, only one method step being required.

Atomic layer deposition (ALD) can designate a method in which compared to a CVD method described above, to produce a layer on a surface, first, a first of at least two gaseous precursor materials is fed to a volume in which the semiconductor layer sequence is provided. The first precursor material can adsorb on the surface of the semiconductor layer sequence. After the surface of the semiconductor layer sequence has been preferably completely or almost completely covered with the first precursor material, depending on the desired layer thickness of the dielectric layer, further monolayers composed of the first precursor material can be deposited on the adsorbed first layer and, finally, a second precursor material can be fed, which reacts with the surface of the dielectric layer formed from the first precursor material, thereby forming the functionalized surface of the dielectric layer formed from the first precursor material. This method thus makes it possible to deposit exactly one monolayer of a functionalized layer on the surface of the dielectric layer.

As in the case of a CVD method, it can be advantageous if the semiconductor layer sequence is heated to a temperature above room temperature. As a result, the reaction that forms the dielectric layer and functionalizes the surface thereof can be initiated thermally. The temperature to be chosen can depend here on the precursor materials.

In this case, a plasmaless variant of atomic layer deposition ("plasmaless atomic layer deposition", PLALD) can designate an ALD method for which, as described below, no plasma is produced, rather in which, to form the monolayers, the reaction of the abovementioned precursor materials is initiated only by way of the temperature of the semiconductor layer sequence to be coated.

Besides temperature or plasma, oxygen or ozone in combination with moderate temperatures of 250° C., for example, are also suitable to initiate the reaction.

A plasma-enhanced variant of atomic layer deposition ("plasma-enhanced atomic layer deposition", PEALD) can designate an ALD method in which the second precursor material is fed while a plasma is produced at the same time, as a result of which, as in the case of PECVD methods, it can be possible that the second precursor material is excited. As a result, the temperature to which the semiconductor layer sequence is heated can be reduced compared to a plasmaless ALD method. The gaseous precursor materials are decomposed by the plasma such that the volatile radicals are split off and the materials of the dielectric layer and the surface functionalization can be deposited.

It is also possible to combine the energy supply from plasma, temperature and oxygen or ozone in ALD methods.

By one of the ALD methods described, in method steps B) and C), three steps that take place successively can be carried out in which in each case the dielectric layer is produced, that surface of the dielectric layer facing away from the semiconductor layer sequence is hydrolyzed and, finally, the hydrolyzed surface is functionalized. A first, gaseous precursor material can be used to produce the dielectric layer, and a gaseous second precursor material can be used to produce the functionalization.

Method steps B) and C) can be carried out simultaneously by plasma-enhanced vapor deposition. A method is thus provided in which the surface functionalization of the dielectric layer can be carried out without an additional method step, whereby a time-, apparatus- and resource-saving process solution is provided. Moreover, a controllable method step is thus provided by which an in situ functionalization of that surface of the dielectric layer facing away from the semiconductor layer sequence is carried out.

At least two precursor materials can be used in method steps B) and C). Tetraethylorthosilane (TEOS) and (3-mercaptopropyl)trimethoxysilane (MPTO) can be selected as precursor materials. These precursor materials are materials suitable to produce a dielectric layer with a functionalized surface. In this case, TEOS can be used as precursor material to produce the dielectric layer, and MPTO can be used as precursor material to produce the functionalization. Instead of TEOS, a two-component precursor material such as $SiH_4/O_2$ or $SiH_4/N_2O$ can also be used.

Using the precursor materials TEOS and MPTO, in method steps B) and C), a thiol-functionalized surface which designates a surface on which SH groups are present, can be formed on a silicon-oxide-containing, for example, an $SiO_2$-containing, layer. In this case, the SH functionalization is a starting material whose sulfur atoms are covalently bonded to the dielectric layer, that is to say to the silicon oxide groups.

If, in a further method step D), the metal layer, which can, for example, comprise silver or consist thereof is applied to the functionalized surface, the metal layer can bind covalently to the functionalized surface, for example, the thiol-functionalized $SiO_2$ surface. If thiol groups are present, for example, these groups can bind applied metal ions by S—H bonds being broken and a proton becoming free. This gives rise to a sulfur-metal bond. If silver is chosen as metal, a silver binding can be produced for example by means of an aqueous silver nitrate ($AgNO_3$) solution. A sulfur layer in the form of a monolayer thus forms from the surface functionalizations and forms an adhesion layer in the optoelectronic component between dielectric layer and metal layer. The adhesion layer has covalent bonds to the dielectric layer and to the metal layer. In an instance in which the adhesion layer comprises a sulfur layer, the sulfur atoms in each case have a covalent bond to the silicon oxide of the dielectric layer and the metal of the metal layer. An $SiO_2$—S-metal surface, in particular an $SiO_2$—S—Ag surface, can thus be produced.

By the abovementioned methods of producing the dielectric layer and functionalization of the surface of the dielectric layer, a homogeneous distribution of SH functionalities which can serve as anchor groups of metals is achieved on the surface of the dielectric layer.

In method step D), the metal layer can be produced by an aqueous dip, for example. In accordance with one example, the aqueous dip can comprise silver nitrate to produce a silver layer.

In a method step following method step D), a further layer can be applied to the metal layer, for example, by sputtering or vapor deposition. The metal layer produced in method step D) then serves as a seed layer for the further layer and thus leads to a homogeneous, defect-reduced and directly linked further layer on the metal layer, without further adhesion promoters having to be used. The further layer can comprise a metal, for example, such that the metal layer is a first metal layer and the further layer is a second metal layer. The second metal layer and the first metal layer can comprise identical or different material. Possible materials of the second metal layer correspond to those which have already been mentioned in connection with the component described above.

Furthermore, the use of tetraethylorthosilane and (3-mercaptopropyl)trimethoxysilane to produce an SH-functionalized surface of a silicon-oxide-containing layer by plasma-enhanced vapor deposition is provided. By this use of TEOS and MPTO, it is thus possible to produce a silicon-oxide-containing layer whose surface is SH-functionalized, wherein the functionalization is performed in situ. The use of these materials for plasma-enhanced vapor deposition makes it possible to produce the silicon-oxide-containing layer with an SH-functionalized surface in a time-saving method.

Examples of our components and methods will be explained in greater detail with reference to the figures.

The figures should not be understood as true to scale. Furthermore, in the figures, mutually corresponding elements are identified by the same reference signs.

The following figures are explained at least partly on the basis of the exemplary precursor materials TEOS and MPTO. TEOS, that is to say tetraethylorthosilane, is represented by Formula 1:

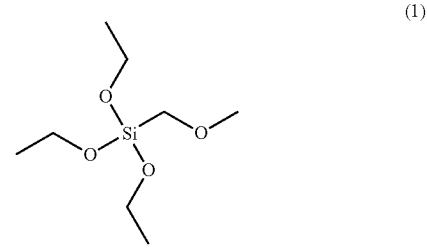

(1)

TEOS is present in liquid form and has a boiling point of 168° C. Its density at 20° C. is 0.933 g/ml. The refractive index n is approximately 1.38, and the vapor pressure is less than 1 mmHg at 20° C. The gas density relative to air is 7.2.

The second precursor material MPTO, that is to say (3-mercaptopropyl)trimethoxysilane, is represented by Formula 2:

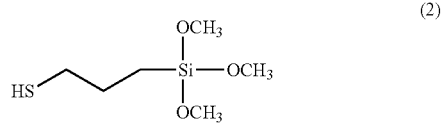 [SMILES: CO[Si](CCCS)(OC)OC]

(2)

This compound is likewise present in liquid form and stored at a temperature of 2 to 8° C. Its density is 1.057 g/ml at 25° C., and the boiling point is between 213 and 215° C. MPTO has a refractive index of 1.444.

Even though the following figures or examples are explained on the basis of TEOS and MPTO, it is equally possible to use other precursor materials to produce dielectric layers having a surface functionalization for forming an adhesion layer.

FIG. 1 shows a schematic side view of a conventional optoelectronic component. The latter comprises a semiconductor layer sequence 10, a dielectric layer 20, a metal layer 40 and a further layer 50. A conventional adhesion promoter layer 3 is arranged between the metal layer and the dielectric layer. Since conventional adhesion promoter layers have disadvantages, for example the formation of microchannels or pores during their application or during the application of the succeeding metal layer 40, the metal layer 40 adheres only poorly to the dielectric layer 20. That has the effect that, for example, moisture can penetrate between these layers, which can lead to a degradation as a result of corrosion of the component.

Figure 2:
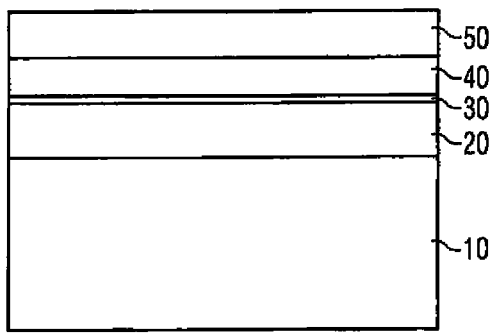
FIG. 2 shows, in schematic side view, an optoelectronic component in accordance with one exemplary embodiment.

FIG. 2 shows, in a schematic side view, an optoelectronic component in accordance with one embodiment. This optoelectronic component comprises an adhesion layer 30 instead of the conventional adhesion promoter layer 3. The adhesion layer 30 is a monolayer which can consist of sulfur, for example. This layer forms covalent bonds both to the dielectric layer 20 and the metal layer 40, whereby an improved adhesion between dielectric layer 20 and metal layer 40 is ensured.

In the following figures, the adhesion layer 30 and the layers adjoining it will be explained in greater detail on the basis of the individual method steps of producing them.

The semiconductor layer sequence 10 can be an epitaxial layer sequence, for example. The dielectric layer 20 can contain, for example, silicon oxide, silicon nitride, yttrium oxide, aluminum oxide, zirconium oxide, titanium oxide or silicon. The metal layer 40 can comprise silver, and the further layer 50 can comprise, for example, metals such as copper, gold, titanium, chromium, palladium, platinum, zinc oxide or nickel. The adhesion layer 30 is suitable for many different combinations of dielectric layers and metal layers and/or further layers. In accordance with one example, the dielectric layer 20 consists of $SiO_2$, the adhesion layer 30 consists of S and the metal layer 40 consists of Ag.

Figure 3A:
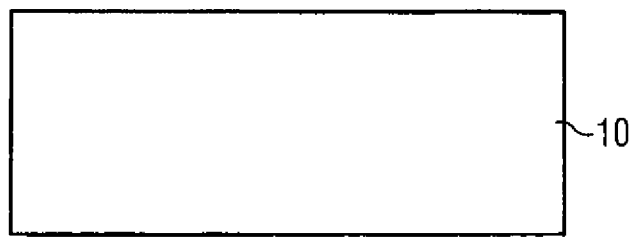
FIGS. 3a-3c show, in schematic side view, a method in accordance with one exemplary embodiment for producing an optoelectronic component.
Figure 3B:
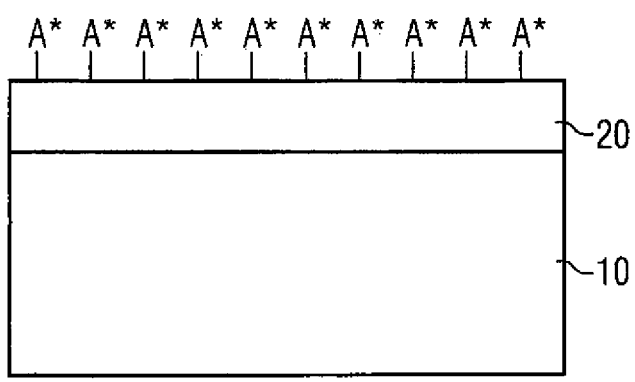
Figure 3C:
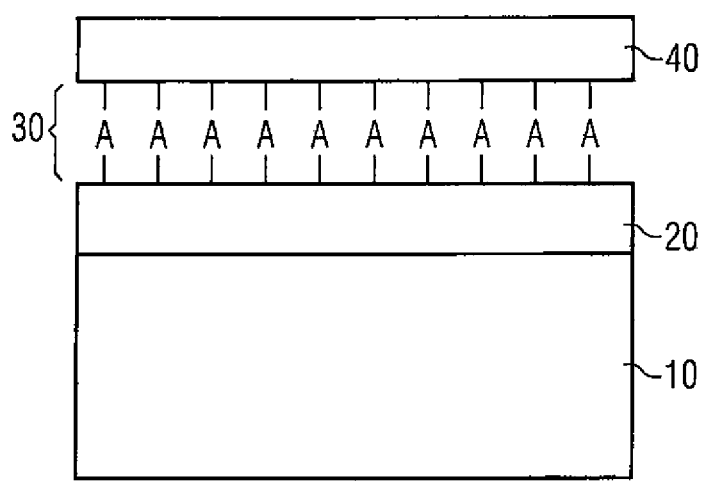

FIGS. 3a to 3c illustrate, in schematic side view, the basic production of a dielectric layer 20 on a semiconductor layer sequence 10, the functionalization thereof and the application of a metal layer 40 to the functionalized dielectric layer 20, the adhesion layer 30 being formed. FIG. 3a illustrates the semiconductor layer sequence 10. A dielectric layer 20 is applied thereto, the dielectric layer having functionalizations A* (FIG. 3b) at the surface facing away from the semiconductor layer sequence 10. The functionalizations A* are bonded to the dielectric layer 20 by covalent bonds. A* stands for starting materials suitable to form a monolayer if a metal layer is applied to the functionalizations A*. Such starting materials are SH groups, for example.

FIG. 3c shows how the functionalizations A* bond covalently with a succeeding metal layer 40 with formation of the adhesion layer 30 (illustrated in an enlarged manner here) and thus form the adhesion layer 30 containing the material A. In this case, A can be sulfur, for example, if A* was an SH group. The adhesion layer 30 containing the material A thus consists of a monolayer of the material A having in each case a covalent bond to the dielectric layer 20 and a covalent bond to the metal layer 40. If the material A is sulfur, for example, the dielectric layer 20 can, for example, contain $SiO_2$ or consist thereof. The metal layer 40 can, for example, contain silver or consist thereof.

The metal layer 40 can be produced, for example, by an aqueous dip 20 being applied to the functionalized dielectric layer, wherein, if a silver layer is intended to be produced, liquid $AgNO_3$ is used. The metal layer 40 can, this not being shown in FIG. 3, constitute a seed layer on which a further layer, for example, a metallization layer, can be applied by vapor deposition or sputtering with a metal such as metallic silver. By virtue of the presence of the adhesion layer 30, the metallization layer then has an improved adhesion to the dielectric layer, for example, an $SiO_2$ layer, since only few or no pores or channels at all are present in the adhesion layer 30.

Figure 4:
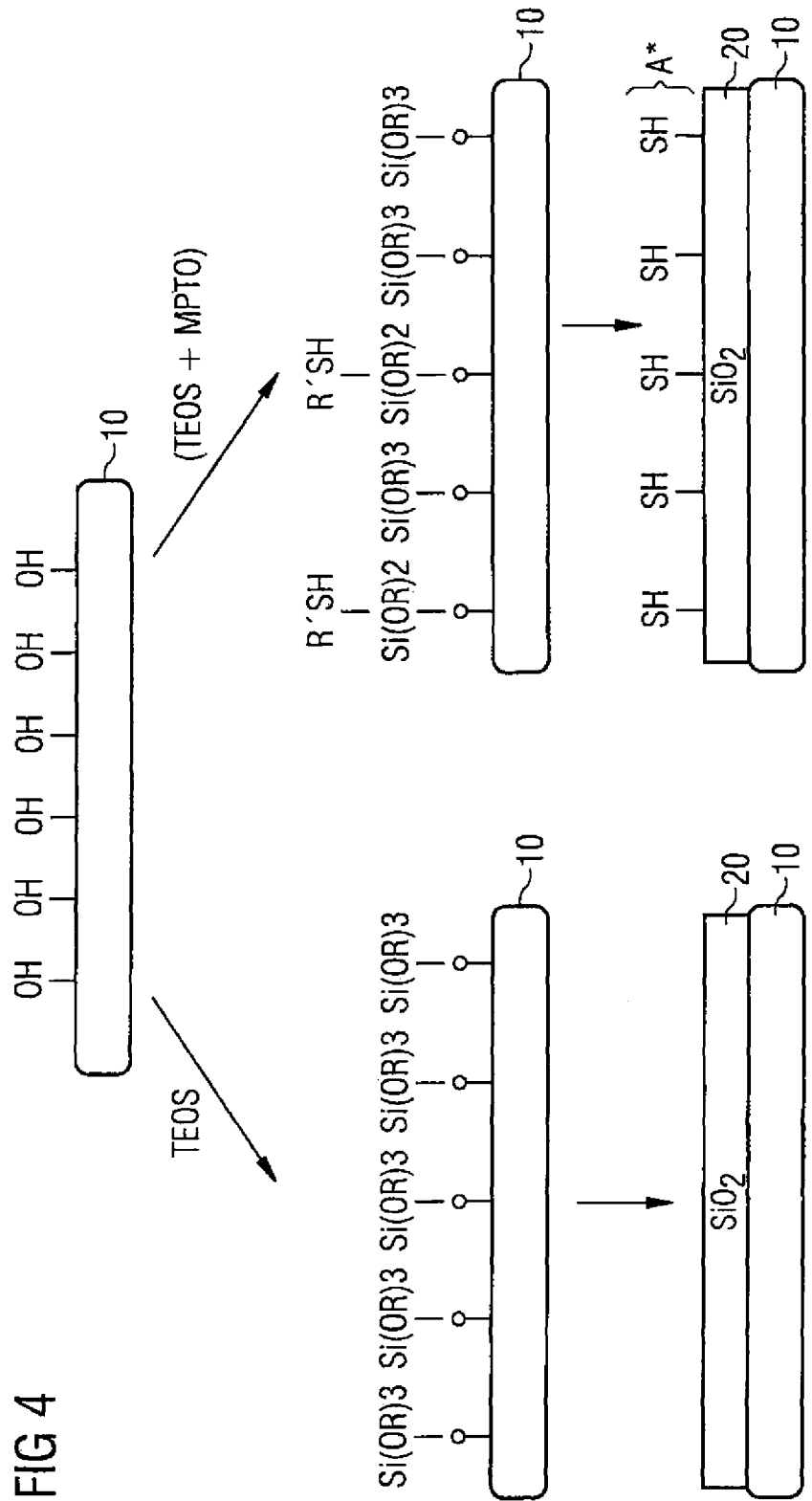
FIG. 4 shows, in schematic side view, a method in accordance with a further exemplary embodiment for producing an optoelectronic component.

FIG. 4 shows the schematic side view of different method steps by which a dielectric layer 20 with a functionalized surface is produced as a precursor with respect to an adhesion layer 30. This figure shows how a functionalized surface on a dielectric layer 20 can be produced by a wet-chemical method. A semiconductor layer sequence 10 having hydroxide (OH) groups on its surface is shown at the top in the figure. If only TEOS and if appropriate solvents such as ethanol and ammonia as precursor component (left-hand arrow) were applied to the semiconductor layer sequence 10 by a wet-chemical method, a dielectric layer composed of $SiO_2$ could thereby be produced, but the dielectric layer would have no functionalization. TEOS binds to the hydroxide groups present on the surface of the semiconductor layer sequence 10, while its volatile constituents, that is to say the alkyl groups, are removed such that a dielectric layer 20 consisting of $SiO_2$ is produced.

In an analogous manner, a mixture of TEOS and MPTO and, if appropriate, solvents such as ethanol and ammonia (right-hand arrow) can be applied to the semiconductor layer sequence 10. In this case, the TEOS once again bonds to the hydroxide groups on the semiconductor layer sequence 10 and, after the volatile constituents have been removed from the TEOS and $SiO_2$ molecules have deposited on the semiconductor layer sequence 10, the MPTO thereupon bonds to the $SiO_2$ molecules. Consequently, a dielectric layer 20 functionalized with SH groups arises through the use of a mixture of TEOS and MPTO.

The production of the dielectric layer 20 in FIG. 4 (right-hand arrow) can also be produced by an ALD or PE-CVD method and its surface can then be OH-terminated wet-chemically with liquid TEOS and finally SH-functionalized with MPTO.

FIG. 5 shows an alternative example of a method of producing a functionalized dielectric layer 20. In this case, method steps B) and C) are produced by atomic layer deposition (ALD). The latter takes place in three steps. First, the semiconductor layer sequence 10, at the surfaces of which OH groups are present, is coated with TEOS to form a dielectric layer 20 consisting of $SiO_2$ (this step is identified by "B"). This coating is effected in monolayers and until the desired thickness, which can be selected, for example, from 50 nm to 1000 nm and can be 100 nm, in particular, if the dielectric layer 20 has been attained. At the same time, the volatile groups, that is to say the alkyl groups, of the TEOS molecules are removed. In a first step H, the surface of the dielectric layer 20 produced is hydrolyzed such that OH groups arise at that surface of the dielectric layer 20 facing away from the semiconductor layer 10. The hydrolysis can be effected by water, water vapor or an $O_2$ plasma and brings about a stoichiometrically largely perfect $SiO_2$ surface with OH terminations, by which a complete functionalization can in turn be effected in a next step. Finally, in a further method step C, MPTO is applied to the hydrolyzed surface of the $SiO_2$-containing dielectric layer 20, the MPTO again being applied in the form of monolayers and forming the SH functionalization on the dielectric layer 20. Organic radicals R still present become volatile as soon as the sulfur is saturated by a bond to silver. This functionalized layer can then be treated with an $AgNO_3$ solution, for example, to produce a metal layer 40 while an adhesion layer 30 is formed (not shown here).

Method steps B) and C) illustrated in FIGS. 4 and 5 can likewise be produced by a plasma-enhanced vapor deposition method (PE-CVD). In this method, TEOS and MPTO are applied to the semiconductor layer sequence 10 simultaneously as gaseous precursor materials in a plasma produced from the precursor materials, which are ionized in a strong radio-frequency alternating electric field (RF power), wherein an inert gas, for example, argon can additionally also be added, and a dielectric layer 20 consisting of $SiO_2$ is thus produced in situ, the dielectric layer having SH functionalizations at its surface. The SH groups are covalently bonded to the $SiO_2$ molecules of the dielectric layer 20 and can likewise form covalent bonds to a further metal layer 40, which can be applied to the functionalizations. Consequently, it is possible to apply an adhesion layer 30 having an improved adhesion effect between the dielectric layer 20 and the metal layer 40 in a very simple manner and by a single process step.

Our components and methods are not restricted by the description on the basis of the examples. Rather, this disclosure encompasses any novel feature and also any combination of features, which in particular includes any combination of features in the appended claims, even if the feature or combination itself is not explicitly specified in the claims or examples.

The invention claimed is:

1. A method of producing an optoelectronic component comprising:
   A) providing a semiconductor layer sequence having an optoelectronically active region;
   B) applying a dielectric layer to the semiconductor layer sequence;
   C) functionalizing a surface of the dielectric layer facing away from the semiconductor layer sequence, wherein B) and C) are simultaneously conducted by plasma-enhanced gas phase deposition or a wet-chemical process; and
   D) applying a metal layer to the functionalized surface, wherein a starting material covalently bonded to the dielectric layer is formed in B) and C), which starting material, in D), forms a covalent bond to the metal layer with formation of an adhesion layer,
   wherein the adhesion layer comprises sulfur; and
   a sulfur atom of the sulfur is bonded to the material of the dielectric layer via a covalent bond, and also to the metal layer via a further covalent bond.

2. The method according to claim 1, wherein at least two precursor materials are used in B) and C).

3. The method according to claim 2, wherein tetraethylorthosilane and (3-mercaptopropyl)trimethoxysilane are selected as precursor materials.

4. The method according claim 3, wherein, in B) and C), a thiol-functionalized surface is formed on a silicon-oxide-containing layer.

5. The method according to claim 2, wherein (3-mercaptopropyl)trimethoxysilane and a two-component precursor material $SiH_4/O_2$ or $SiH_4/N_2O$ are selected as precursor materials.

6. The method according to claim 1, wherein 1) the dielectric layer comprises a material selected from the group consisting of silicon oxide, silicon nitride, aluminum oxide, zirconium oxide, titanium oxide, yttrium oxide and silicon, and 2) the metal layer comprises silver.

7. The method according to claim 1, wherein a further layer is applied on the metal layer, and the further layer comprises a material selected from the group consisting of Ag, Au, Ge, Ni, Ti, Cr, Pd, Pt, ZnO and Cu.

8. The method according to claim 1, wherein, in B) and C), first and second precursor materials are deposited on the semiconductor layer sequence by plasma-enhanced gas phase deposition, and the dielectric layer forms from the first precursor material and is functionalized in situ by the second precursor material.

9. The method according to claim 1, wherein, in D), the metal layer is produced by an aqueous dip, and the aqueous dip comprises silver nitrate that produces a silver layer.

* * * * *